United States Patent
Meidan et al.

(10) Patent No.: US 9,791,506 B1
(45) Date of Patent: Oct. 17, 2017

(54) CROSS-PLATFORM DEVICE TESTING THROUGH LOW LEVEL DRIVERS

(71) Applicant: Amazon Technologies, Inc., Seattle, WA (US)

(72) Inventors: Yaniv Meidan, Binyamina (IL); Ronen Shitrit, Kiryat Ata (IL); Guy Zalik, Yokne'am Illit (IL); Barak Wasserstrom, Mitzpe Aviv (IL)

(73) Assignee: AMAZON TECHNOLOGIES, INC., Seattle, WA (US)

( * ) Notice: Subject to any disclaimer, the term of this patent is extended or adjusted under 35 U.S.C. 154(b) by 28 days.

(21) Appl. No.: 14/925,044

(22) Filed: Oct. 28, 2015

(51) Int. Cl.
*G01R 31/28* (2006.01)
*G01R 31/3177* (2006.01)
*G01R 31/317* (2006.01)

(52) U.S. Cl.
CPC ... *G01R 31/3177* (2013.01); *G01R 31/31723* (2013.01)

(58) Field of Classification Search
None
See application file for complete search history.

(56) References Cited

U.S. PATENT DOCUMENTS

| | | | | |
|---|---|---|---|---|
| 4,707,834 A | * | 11/1987 | Frisch | G01R 31/31907 324/73.1 |
| 7,548,828 B2 | * | 6/2009 | Gil | G01R 31/31907 324/750.3 |
| 8,788,882 B2 | * | 7/2014 | Schroeder | G06F 11/263 714/32 |
| 9,459,978 B2 | * | 10/2016 | Fritzsche | G06F 11/2294 |
| 2003/0208713 A1 | * | 11/2003 | Evans | G01R 31/3171 714/742 |
| 2005/0261856 A1 | * | 11/2005 | Kushnick | G01R 31/31907 702/117 |
| 2008/0030203 A1 | * | 2/2008 | Chung | G01R 31/2834 324/537 |
| 2009/0119559 A1 | * | 5/2009 | Foutz | G06F 11/267 714/729 |

* cited by examiner

*Primary Examiner* — Daniel McMahon
(74) *Attorney, Agent, or Firm* — Thomas Horstemeyer, LLP; Michael J. D'Aurelio; Jason M. Perilla (57) ABSTRACT

In one example case, a cross-platform system includes a first automated test platform having a first test instrument and a first glue layer interface that exposes test functions to direct testing by the first test instrument. The system further includes a second automated test platform having a second test instrument and a second glue layer interface that exposes the same test functions to direct testing by the second test instrument. In the system, the glue layers abstract the respective and different control commands used by the different, first and second test instruments. Using the glue layers, the same higher-level test code can be executed by the control computers of both the first and second automated test platforms.

20 Claims, 5 Drawing Sheets

CROSS-PLATFORM DEVICE TESTING THROUGH LOW LEVEL DRIVERS

BACKGROUND

Automated test equipment (ATE) can be used to evaluate and test various operating parameters and characteristics of components, such as discrete electronic components, integrated circuits, and larger subsystems and devices, for example. In that context, ATEs can be used among various stages in the design, development, manufacture, and assembly of electronic components to evaluate and test them under different environmental conditions, such as ranges of operating temperatures, and across different operating specifications, such as operating voltages, timings, input and output conditions, etc.

BRIEF DESCRIPTION OF THE DRAWINGS

Many aspects of the present disclosure can be better understood with reference to the following drawings. The components in the drawings are not necessarily to scale, with emphasis instead being placed upon clearly illustrating the principles of the disclosure. Moreover, in the drawings, like reference numerals designate corresponding parts throughout the several views.

DETAILED DESCRIPTION

As noted above, ATEs can be used among various stages in the design, development, manufacture, and assembly of electronic components to evaluate and test them under different environmental conditions, such as ranges of operating temperatures, and across different operating specifications, such as operating voltages, timings, input and output conditions, etc. Among different manufacturers, ATEs can be relatively simple or more complicated test systems, sometimes including several different types of test instruments capable of accessing the features of and diagnosing faults in components. Some ATEs include enough test instruments to simultaneously test several devices at a time, for increased throughput.

An ATE can be embodied as a system including a control computer to direct the overall operation of the ATE, a series of test instruments for testing one or more Devices Under Test (DUTs), and a test instrument controller to control the operation of the test instruments. The ATE can also include various interfaces between its subsystems, such as an interface for communications between the control computer and the test instrument controller. DUTs can be electrically coupled to the test instruments of the ATE by a prober or handler, for example, which may rely upon customized electrical and/or mechanical adapters to hold and electrically couple to the DUTs. The test instruments in each ATE are typically controlled using a set of low-level instructions or commands provided by the control computer of the ATE to the test instrument controller of the ATE. Because various types of ATEs are manufactured by different vendors, the instructions to control the test instruments of one ATE may be entirely different than those for another ATE. Thus, it may be difficult to reuse test code among two different ATEs.

According to the embodiments described herein, a body of higher-level test code is executed on a control computer of an ATE to test electronic components. The body of test code may be written in a relatively high-level programming language, such as C, C++, C#, Objective C, Perl, etc., that can be interpreted and translated into instructions executable by the control computer. During execution on the control computer, the test code interacts with a device hardware abstraction layer which, in turn, interfaces with a glue layer between the device hardware abstraction layer and the test instruments of the ATE. The glue layer is designed to abstract the interface between the test instruments and the control computer of the ATE. The glue layer exposes a plurality of test functions to the control computer, so that the control computer can direct various test instruments of the ATE through the test functions rather than through the low-level instructions of the test instruments. In turn, based on a call to one of the plurality of test functions, for example, the glue layer generates a set of low-level control commands understood by the test instruments of the ATE. Using the glue layer, ATEs can be operated using higher-level test code, including test code that can be executed on multiple ATEs without any (or with little) need to modify it for each ATE.

In an ATE, the operating instruction set of the control computer is different than that of its test instruments. Thus, according to aspects of the embodiments described herein, the glue layer can be relied upon to declare and expose variables, functions, function calls, etc. through which the body of test code executing on the control computer of the ATE can direct the test instruments of the ATE. The glue layer can offer certain advantages, including the ability to bifurcate the execution of test code on the control computer from the execution of the control commands by the test instruments of the ATE. It also offers a feedback pathway through which test results can be provided from the test instruments back to the test code executing on the control computer. With reference to the test results, the test code can make certain decisions, such as whether to halt testing, what other tests to perform, and how the general approach to testing should be modified, for example, based on the logic in the test code.

Further, in some cases, the glue layer offers the ability to achieve at least some reusability of test code among different ATE platforms. In other words, for ATE platforms that rely upon x86-based control computers, a body of test code written in a software language for x86-based execution can be executed on all those ATE platforms. At the same time, if the glue layers for two different ATE platforms both expose the same variables, functions, function calls, etc., then the higher-level test code may not need to be modified to account for the differences that may exist between the physical layer and communications protocol interfaces used to interface with the test instruments of the two different ATE platforms. Instead of modifying the test code, the glue layers of the two different ATE platforms can be modified, to the extent necessary, to account for the differences between the interfaces, the test instruments, and/or the test instrument controllers of the two different ATE platforms.

Figure 1:
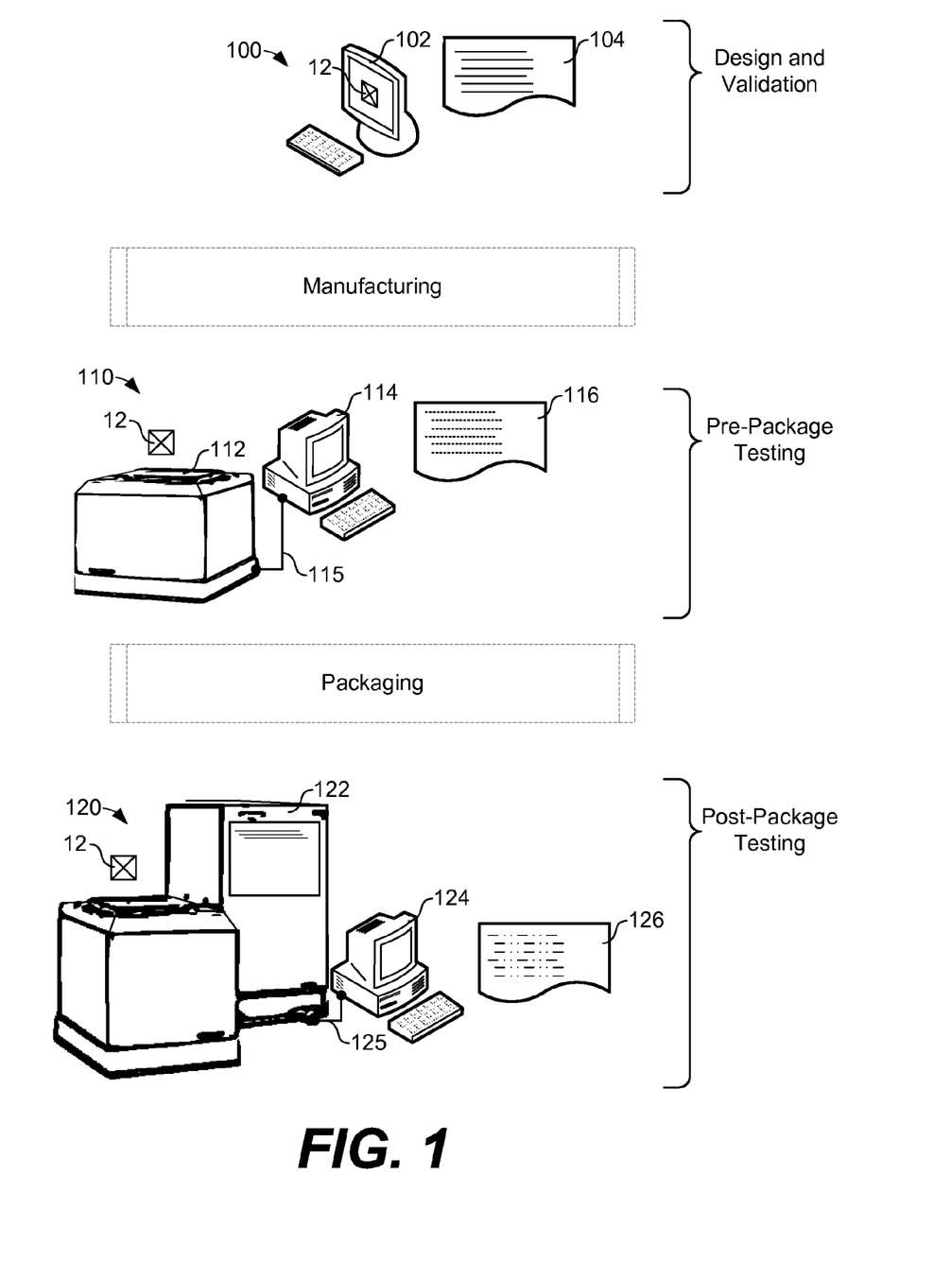
FIG. 1 illustrates different platforms that can be used for device testing over various stages of design, development, manufacturing, and assembly according to various example embodiments described herein.

Turning to the figures for further description, FIG. 1 illustrates different platforms that can be used for device testing over various stages of design, development, manufacturing, and assembly of components. FIG. 1 illustrates a first platform 100, a second platform 110, and a third platform 120. The first platform 100 can be embodied as a computer system 102 for the design and/or development of electronics components, such as discrete electronic components, integrated circuits, and larger subsystems and devices, among other components. In that context, the first platform 100 can execute various software development tools, logic development and verification tools, layout and validation tools, simulation tools, debugging tools, etc.

The second platform 110 can be embodied as an ATE including test instruments 112, a control computer 114, and an interface 115 between the test instruments 112 and the control computer 114. Similarly, the third platform 120 can be embodied as an ATE including test instruments 122, a control computer 124, and an interface 125 between the test instruments 122 and the control computer 124. The first platform 100, the second platform 110, and the third platform 120 are provided as examples of design, development, verification, and ATE platforms that can incorporate the concepts of testing through low level drivers described herein. The description of the platforms 100, 110, and 120 is not intended to be limiting as to the scope of the embodiments, as the concepts can be applied to any suitable design, development, and automated testing platforms.

At the design and validation stage, the software development tools on the computer system 102 can be used to design and validate various electronic components, such as the DUT 12. One or more of the software development tools on the computer system 102 can provide the option of testing the design of the DUT 12 using the test code 104. The test code 104 may include a sequence of tests for the evaluation of the DUT 12 during its design.

After the DUT 12 is designed and validated on the computer system 102, it may be manufactured using any suitable semiconductor manufacturing process. Because defects can be introduced at various stages in the manufacturing process, it is usually important to test the DUT 12 to identify any defects in it after manufacturing. At the pre-package testing stage, the DUT 12 can be tested using the second platform 110, for example, while the DUT 12 is still part of a larger semiconductor wafer. In that context, it is noted that ATEs can be used to test individual integrated circuits on a silicon wafer, for example, before the individual integrated circuits are separated from each other. Wafer-based ATEs typically use a probe assembly that moves from device-to-device across a silicon wafer, testing each device individually. To improve test time throughputs, a probe assembly may include sufficient probes to test multiple devices at the same time. Thus, in the second platform 110, silicon wafers can be tested directly using electrical connections made with high precision probes, whereas, in package-based ATEs, such as the third platform 120, packaged parts can be tested using a device handler.

The test instruments 112 of the second platform 110 can be embodied as any number of different instruments capable of testing a wide range of operating characteristics and/or parameters of DUTs, including the DUT 12. The test instruments 112 can include power supplies, loads, signal analyzers, parametric measurement units, waveform generators, and digitizers, for example, among other instruments. Once electrically coupled to the DUT 12 using probes, for example, the test instruments 112 can be directed by the control computer 114 to access features and perform measurements on the DUT 12. If the DUT 12 were a memory device, for example, the control computer 114 can direct the test instruments 112 to generate the necessary logic levels (e.g., voltage levels), at the correct timings and on the correct address, data, and control inputs of the DUT 12, to read from and/or write to the DUT 12.

In the second platform 110, the control computer 114 can direct the overall operation of the test instruments 112 according to a set of test instructions in the test code 116. Particularly, the test code 116 may include a set of low-level instructions to perform a sequence of tests for evaluation of the DUT 12. To perform any one of the tests in the sequence, it may be necessary to send several (e.g., tens, hundreds, or more) individual instructions to the test instruments 112. The instructions may direct the test instruments 112 to turn power supplies on and off, to set voltages for logic levels on various inputs, transition logic levels (e.g., on, off, true, false, etc.) at certain times, set impedance states for certain inputs, read voltages at certain times, etc. Even in devices of relatively low complexity, integrated circuits often include several control inputs, outputs, address buses, data buses, etc. Thus, even a test of one function of the DUT 12, for example, may require the definition of power supply voltages, control logic states, and a combination of address and data bus logic levels over time. Thus, it can be appreciated that the test code 116 can become relatively lengthy and difficult to modify and maintain.

If the DUT 12 passes the pre-package testing stage on the second platform 110, it can be electronically and/or physically marked as a good sample, separated from other semiconductor devices on the same wafer, and packaged in a suitable device package. Because defects can exist in device packages and devices can be damaged during packaging, it is usually important to test the DUT 12 at the post-package testing stage using the third platform 120. At the post-package testing stage, the DUT 12 can be tested using the third platform 120. The test instruments 122 of the third platform 120 can also be embodied as any number of different instruments capable of testing a wide range of operating characteristics and/or parameters of DUTs. Similar to the test instruments 112, the test instruments 122 can include power supplies, loads, signal analyzers, parametric measurement units, waveform generators, and digitizers, among other instruments. Once electrically coupled to the DUT 12 using a device placement tool, such as an automated device handler, the test instruments 122 can be directed by the control computer 124 to access features and perform test measurements on the DUT 12 among other DUTs being tested simultaneously.

In the third platform 120, the control computer 124 can direct the overall operation of the test instruments 122 according to a set of test instructions in the test code 126. Similar to the test code 116, the test code 126 may include a set of low-level instructions to perform a sequence of tests for evaluation of the DUT 12 on the third platform 120. The instructions may direct the test instruments 122 to turn power supplies on and off, to set voltages for logic levels on various inputs, transition logic levels (e.g., on, off, true, false, etc.) at certain times, set impedance states for certain inputs, read voltages at certain times, etc. Because a test of one function of the DUT 12, for example, may require the definition of power supply voltages, control logic states, and a combination of address and data bus logic levels over time, the test code 126 can become relatively lengthy and difficult to modify and maintain.

Figure 2A:
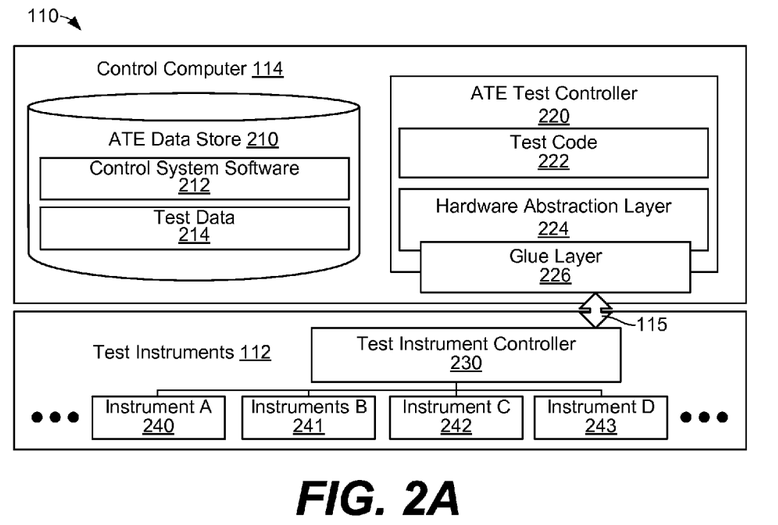
FIGS. 2A and 2B illustrate the computer and instrument control environments of different testing platforms that can be used for device testing according to various example embodiments described herein.
Figure 2B:
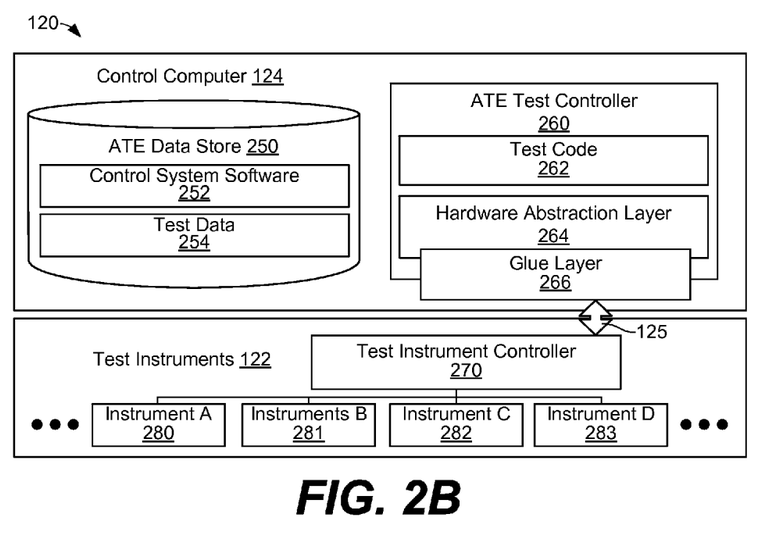

Before turning to FIGS. 2A and 2B, it is noted that, in some embodiments, the platforms 100, 110, and 120 may be embodied as different types of testing platforms and/or test instruments. For example, the second platform 110 may be manufactured by one manufacturer of ATE equipment, and the third platform 120 may be manufactured by another manufacturer of ATE equipment. Thus, the test instruments 112 of the second platform 110 may be different than the test instruments 122 of the third platform 120. Further, the test instruments 112 of the second platform 110 may be controlled or operated using different sets of industry-standard, proprietary, or combination of industry-standard and proprietary instructions than the test instruments 122 of the third platform 120. Thus, even to perform the same tests on the DUT 12, it may be necessary for the control computer 114 to use different instructions to control the operation of the test instruments 112 than the control computer 124 uses to control the operation of the test instruments 122. Thus, the test code 116 may include different instructions than the test code 126. Similarly, the test code 104 may include different instructions than either the test code 116 or the test code 126. As such, the test code used on any given one of the platforms 100, 110, and 120 may not be usable on any other one of the platforms 100, 110, and 120, leading to increased time to develop tests across ATE platforms and additional difficulty in modifying and maintaining test code.

In an effort to achieve a more uniform bed of test code for use across different ATE platforms, the embodiments described herein incorporate a glue layer between a device hardware abstraction layer and test instruments of ATEs. The glue layer is designed to abstract the interfaces between the test instruments and the control computers of ATEs, such as the interfaces 115 and 125 between the test instruments 112 and 122 and the control computers 114 and 124, respectively. In one aspect of the embodiments, the glue layer exposes variables, functions, function calls, etc. for higher-level software executing on a control computer of an ATE, so that the control computer can direct various test instruments of the ATE through the exposed functions rather than through the test-instrument-specific low-level instructions of the ATE. In turn, based on a call to one of the plurality of exposed functions, for example, the glue layer of the ATE can generate a set of test-instrument-specific low-level control commands understood by the test instruments of the ATE. Using the glue layer, ATEs can be operated using higher-level test code, including test code that can be executed on multiple ATEs without (or with little) need to develop the test code for each of the ATEs.

FIG. 2A illustrates the computer and instrument control environments of the second platform 110, and FIG. 2B illustrates the computer and instrument control environments of the third platform 120. As discussed below, in FIG. 2A, the second platform 110 incorporates the concepts of using a low-level hardware abstraction driver layer and a glue layer to interface between the control computer 114 and the test instruments 112. Similarly, in FIG. 2B the third platform 120 incorporates the concepts of using a low-level hardware abstraction driver layer and a glue layer to interface between the control computer 124 and the test instruments 122. Although not shown in FIGS. 2A and 2B, the second platform 110 and the third platform 120 may be communicatively coupled to each other by a network, such as the Internet, intranets, extranets, wide area networks (WANs), local area networks (LANs), wired networks, wireless (e.g., cellular, 802.11-based (WiFi), Bluetooth, etc.) networks, cable networks, satellite networks, other suitable networks, or any combinations thereof.

As shown in FIG. 2A, the second platform 110 includes the control computer 114, the test instruments 112, and the interface 115 between the control computer 114 and the test instruments 112. As described in further detail below with reference to FIG. 5, the control computer 114 may be embodied as a computing device including one or more processors and memory devices.

The control computer 114 of the second platform 110 includes the ATE data store 210 and the ATE test controller 220. The ATE data store 210 includes the control system software 212 and the test data 214, and the ATE test controller 220 includes the test code 222, the hardware abstraction layer 224, and the glue layer 226. The test instruments 112 include the test instrument controller 230 and the instruments A-D 240-243. The ATE data store 210 can be embodied as any suitable storage device, including any of those described below with reference to FIG. 5.

The control system software 212 includes system software executable by the control computer 114, such as an operating system for the control computer 114 and any applications that execute on the operating system. In various embodiments, the applications may include an application for testing devices using the test instruments 112. However, according to aspects of the embodiments, it may not be necessary to execute any particular testing software on the control computer 114. Instead, the high-level test code (e.g., the test code 222) may execute directly on one or more processors of the control computer 114, without any intermediary testing software. In that context, the control system software 212 may include the test code 222, and the execution of the test code 222 may invoke or embody the ATE test controller 220. The test data 214 may include data gathered by the test instruments 112 while testing devices, for example, in any format.

To test devices, the ATE test controller 220 executes the test code 222, which may be stored as part of the control system software 212, and processes a sequence of tests defined in the test code 222. In one embodiment, the test code 222 may be written in a relatively high-level programming language, such as C, C++, C#, Objective C, Perl, etc., that can be interpreted and executed by one or more processors of the control computer 114. During execution on the control computer 114, the test code 222 interacts with the hardware abstraction layer 224 which, in turn, interfaces with the glue layer 226. As shown in FIG. 2A, the glue layer 226 is interposed between the hardware abstraction layer 224 and the test instruments 112 of the second platform 110. The test code 222, in various embodiments, can include any test or sequence of tests, depending upon the type of devices being tested using the second platform 110. The sequence of tests in the test code 222 may vary widely based on the type of devices being tested, because different types of tests are typically used to identify defects in different types of devices.

As compared to the test code 116 or the test code 126 in FIG. 1, the test code 222 may not include any (or may only include few) low-level instructions for the test instruments 112. Instead, the test code 222 may be embodied as a high-level list that defines types of tests, memory and/or register locations for testing, address ranges for testing, etc., without defining the particular way in which the test instruments 112 are instructed to perform the tests. The test code 222 may also define the over-arching logical flow of testing, including test-branch decisions, test loops, etc., without defining the particular way in which the test instruments 112 are instructed to perform the tests.

The hardware abstraction layer 224 is designed to resolve, based on the sequence of tests defined in the test code 222, one or more signaling transactions to interface with, access, and test various features of DUTs. In one embodiment, the hardware abstraction layer 224 is specific to the type or types of DUTs being tested. For example, if a particular memory device is being tested, the hardware abstraction layer 224 can be configured to resolve, for a particular type of read operation defined in the test code 222, a signaling transaction including a particular timing and combination of logic level input signals for the address, data, and control signal inputs of the particular memory device. Similarly, for other types of tests defined in the test code 222, the hardware abstraction layer 224 can resolve one or more signaling transactions to access and test features of certain devices according to the operating specifications of the devices.

As noted above, because the manner of signaling a device to access features on it may be different than for other devices, the hardware abstraction layer 224 may generate different signaling transactions for different types of devices. Thus, in one embodiment, the hardware abstraction layer 224 used for testing one device may be different than that used for testing another device. Generally, the hardware abstraction layer 224 can be considered a type of low level driver that generates signaling transactions to test devices using the second platform 110, and each signaling transaction may include a sequence of logic (e.g., voltage) levels to be applied, over some period of time, to one or more control inputs of the devices. A signaling transaction may define both a sequence of logic levels for input to devices, as well as a sequence and/or timing of outputs to read from the devices.

The glue layer 226 is configured to abstract the interface 115 between the test instrument controller 230 and the control computer 114. In that context, the glue layer 226 is configured to expose certain variables, functions, function calls, etc. to the hardware abstraction layer 224. The variables and functions are made available as a set of standard control variables and functions through which the hardware abstraction layer 224 can control the test instruments 112. When a request to perform a test (or a portion of a test) is received by the glue layer 226 from the hardware abstraction layer 224, the glue layer 226 generates a set of control commands for the test instrument controller 230 to control one or more of the instruments A-D 240-243 to carry out the test.

The glue layer 226 can be viewed as having two parts, one that exposes variables, functions, function calls, etc. to the hardware abstraction layer 224, and another that provides test-instrument-specific control commands to the test instrument controller 230 and/or the instruments A-D 240-243. In that context, based on a call to one of the plurality of functions exposed by the glue layer 226, for example, the glue layer 226 can generate a set of low-level control commands understood by the test instrument controller 230 and/or the instruments A-D 240-243. The low-level control commands may conform to the physical layer, associated applications programming interface, and/or other protocols of the interface 115. In some embodiments, the low-level control commands generated by the glue layer 226 may be similar, at least in part, to the low-level instructions of the test code 116 and/or 126 in FIG. 1.

The interface 115 can be embodied as any suitable physical layer interface, such as the RS-232 bus, the general purpose interface bus (GPIB), the Institute of Electrical and Electronics Engineers 488 (IEEE-488) bus, the Local Area Network eXtension for Instrumentation (LXI) bus, the Versa Module Europa eXtension for Instrumentation (VXI) bus, or the Peripheral Component Interconnect eXtension for Instrumentation (PXI) bus, among others. Along with the physical layer connection, the interface 115 may rely upon an associated protocol and/or applications programming interface, such as the Standard Commands for Programmable Instrumentation (SCR), the Virtual Instrument Software Architecture (VISA), or the High-Speed LAN Instrument Protocol (HiSLIP) interface, for example, that provides a protocol interface between the control computer 114 and the test instruments 112.

The test instrument controller 230 can be embodied as one or more embedded controllers, processors, and/or processing circuits, with memory, that direct the operation and timing of tests performed by the instruments A-D 240-243. In one embodiment, the test instrument controller 230 includes one or more digital signal processors to output continuous analog signals to DUTs and measure, filter, and/or evaluate continuous real-world analog signals from DUTs. In that context, the test instrument controller 230 is configured to coordinate the overall operation of the instruments A-D 240-243 based on instructions received from the control computer 114 over the interface 115. As discussed above, the instruments A-D 240-243 may be embodied as power supplies, loads, signal analyzers, parametric measurement units, waveform generators, and digitizers, for example, among other instruments, and the test instrument controller 230 is configured to coordinate the overall operation of those instruments. In some embodiments, the test instrument controller 230 can be omitted, and the control computer 114 can interface directly with the instruments A-D 240-243.

Turning to FIG. 2B, the third platform 120 includes the control computer 124, the test instruments 122, and the interface 125 between the control computer 124 and the test instruments 122. The control computer 124 includes the ATE data store 250 and the ATE test controller 260. The ATE data store 250 includes the control system software 252 and the test data 254, each of which is similar to the control system software 212 and the test data 214. The ATE test controller 260 includes the test code 262, the hardware abstraction layer 264, and the glue layer 266. The test instruments 122 include the test instrument controller 270 and the instruments A-D 280-283.

To test devices, such as the DUT 12 in FIG. 1, the ATE test controller 260 executes the test code 262, which may be stored as part of the control system software 252, and processes a sequence of tests defined in the test code 262. In one embodiment, the test code 262 may be written in a relatively high-level programming language, such as C, C++, C#, Objective C, Perl, etc., that can be interpreted and executed by one or more processors of the control computer 124. During execution on the control computer 124, the test code 262 interacts with the hardware abstraction layer 264 which, in turn, interfaces with the glue layer 266. As shown in FIG. 2B, the glue layer 266 is interposed between the hardware abstraction layer 264 and the test instruments 122 of the third platform 120. The test code 262, in various embodiments, can include any test or sequence of tests, depending upon the type of devices being tested using the third platform 120.

As compared to the test code 116 or the test code 126 in FIG. 1, the test code 262 may not include any (or may only include few) low-level instructions for the test instruments 122. Instead, the test code 262 may be embodied as a high-level list that defines types of tests, memory and/or register locations for testing, address ranges for testing, etc., without defining the particular way in which the test instruments 122 are instructed to perform the tests. The test code 262 may also define the over-arching logical flow of testing, including test-branch decisions, test loops, etc., without defining the particular way in which the test instruments 122 are instructed to perform the tests. In some cases, the test code 262 may be the same as (or nearly the same as) the test code 222, although test instruments 112 of the second platform 110 are directed by different control commands than the test instruments 122 of the third platform 120.

The hardware abstraction layer 264 is similar to the hardware abstraction layer 224 and is designed to resolve, based on the sequence of tests defined in the test code 262, one or more signaling transactions to interface with, access, and test various features of DUTs. In one embodiment, the hardware abstraction layer 264 is specific to the type or types of DUTs being tested. As noted above, because the manner of using or accessing features on one device may be different than on others, the hardware abstraction layer 264 may generate different signaling transactions for different types of devices. Thus, in one embodiment, the hardware abstraction layer 264 used for testing one device may be different than that used for testing another device. Generally, the hardware abstraction layer 264 can be considered a type of low level driver that generates signaling transactions to test devices using the third platform 120.

The glue layer 266 is configured to abstract the interface 125 between the test instrument controller 270 and the control computer 124. In that context, the glue layer 266 is configured to expose certain variables, functions, function calls, etc. to the hardware abstraction layer 264. The variables and functions are made available as a set of standard control variables and functions through which the hardware abstraction layer 264 can control the test instruments 122. When a request to perform a test (or a portion of a test) is received by the glue layer 266 from the hardware abstraction layer 264, the glue layer 266 generates a set of control commands for the test instrument controller 270 to control one or more of the instruments A-D 280-283 to carry out the test.

Similar to the glue layer 226, the glue layer 266 can be viewed as having two parts, one that exposes variables, functions, function calls, etc. to the hardware abstraction layer 264, and another that provides test-instrument-specific control commands to the test instrument controller 270 and/or the instruments A-D 280-293. In that context, based on a call to one of the plurality of functions exposed by the glue layer 266, for example, the glue layer 266 can generate a set of low-level control commands understood by the test instrument controller 270 and/or the instruments A-D 280-283. The low-level control commands may conform to the physical layer, associated applications programming interface, and/or other protocols of the interface 115. In some embodiments, the low-level control commands generated by the glue layer 266 may be similar, at least in part, to the low-level instructions of the test code 116 and/or 126 in FIG. 1.

Similar to the interface 115, the interface 125 can be embodied as any suitable physical layer interface, such as the RS-232 bus, the general purpose interface bus (GPIB), the Institute of Electrical and Electronics Engineers 488 (IEEE-488) bus, the Local Area Network eXtension for Instrumentation (LXI) bus, the Versa Module Europa eXtension for Instrumentation (VXI) bus, or the Peripheral Component Interconnect eXtension for Instrumentation (PXI) bus, among others. Along with the physical layer connection, the interface 125 may rely upon an associated protocol and/or applications programming interface, such as the Standard Commands for Programmable Instrumentation (SCR), the Virtual Instrument Software Architecture (VISA), or the High-Speed LAN Instrument Protocol (HiSLIP) interface, for example, that provides a protocol interface between the control computer 124 and the test instruments 122.

The test instrument controller 270 can be embodied as one or more processors and/or processing circuits, with memory, that direct the operation and timing of tests performed by the instruments A-D 280-283. In other words, the test instrument controller 270 is configured to coordinate the overall operation of the instruments A-D 280-283 based on instructions received from the control computer 124 over the interface 125. As discussed above, the instruments A-D 280-283 may be embodied as power supplies, loads, signal analyzers, parametric measurement units, waveform generators, and digitizers, for example, among other instruments, and the test instrument controller 270 is configured to coordinate the overall operation of those instruments. In some embodiments, the test instrument controller 270 can be omitted, and the control computer 124 can interface directly with the instruments A-D 280-283.

As noted above, both the second platform 110 shown in FIG. 2A and the third platform 120 shown in FIG. 2B incorporate the concepts of using a low-level hardware abstraction driver layer and a glue layer. Because both the second platform 110 and the third platform 120 incorporate those concepts, certain advantages in cross-platform device testing can be achieved. In FIG. 1, for example, the test code 116 executed on the second platform 110 was substantially (if not entirely) different than the test code 126 executed on the third platform 120. That difference was attributed, at least in part, to the differences between the test instruments 112 and the test instruments 122, as well as the differences between the interface 115 and the interface 125. However, when incorporating the hardware abstraction layer 224 and the glue layer 226 in the second platform 110 and the hardware abstraction layer 264 and the glue layer 266 in the third platform 120, as shown in FIGS. 2A and 2B, the test code 222 can be substantially (if not entirely) the same as the test code 262. The test code 222 can be substantially the same as the test code 262 despite the differences between the test instruments 112 and the test instruments 122 and/or the differences between the interface 115 and the interface 125.

In the embodiments shown in FIGS. 2A and 2B, the hardware abstraction layers 224 and 264 and the glue layers 226 and 266 can be relied upon to mask the differences between the test instruments 112 and the test instruments 122 and/or the differences between the interface 115 and the interface 125. In doing so, for testing the same DUT, the test code 222 can be the same as or similar to the test code 262, for both the second platform 110 and the third platform 120. In other words, from the standpoint of the execution of high-level test code on the second platform 110 and the third platform 120, a standard set of variables, functions, function calls, etc. are exposed by both the glue layer 226 and the glue layer 266. Thus, those same variables and functions can be used to control the test instruments 112 and the test instruments 122, and the test code 222 can be substantially the same as the test code 262.

As new test platforms using different test instruments, controllers, and/or interfaces are developed, new glue layers can be developed for the new test platforms. The new glue layers can expose the same standard set of variables, functions, function calls, etc. while, at the same time, be designed to generate the control commands for the new test instruments and/or interfaces of the new test platforms. After the new glue layers are developed, the same high-level test code can be reused on the new test platforms. To the extent necessary, new hardware abstraction layers can be developed for new devices and/or testing platforms. Additionally, the use of hardware abstraction and glue layers, as described herein, can be extended to other design, development, verification, and ATE platforms, including the first platform 100 in FIG. 1.

Figure 3:
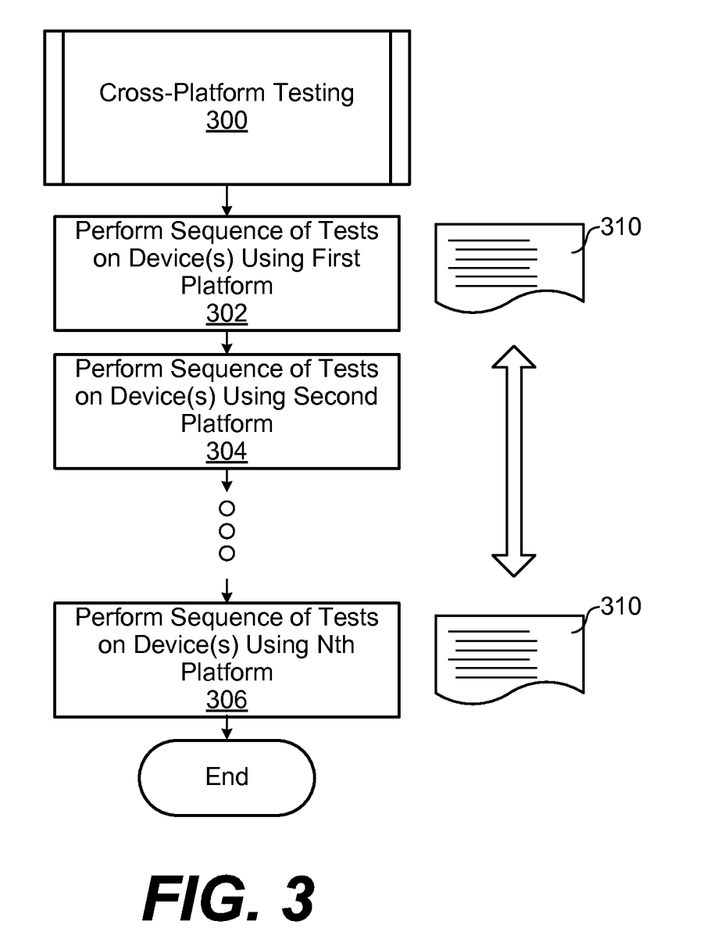
FIG. 3 illustrates a process of cross-platform testing performed by different testing platforms according to an example embodiment described herein.

FIG. 3 illustrates a process 300 of cross-platform testing performed by different testing platforms according to an example embodiment described herein. At reference numeral 302, the process 300 includes performing, on a first automated test platform, a sequence of tests defined in test code 310 to evaluate one or more DUTs. The testing at reference numeral 302 may be performed at a first stage in the design, development, manufacturing, and/or assembly of the DUTs. The first automated test platform may be similar to either the second platform 110 or the third platform 120 and incorporate hardware abstraction and glue layers, as described above with reference to FIGS. 2A and 2B, for example.

At reference numeral 304, the process 300 includes performing, on a second automated test platform, the sequence of tests defined in the test code 310 to evaluate the same DUTs tested at reference numeral 302. The testing at reference numeral 304 may be performed at a second stage in the design, development, manufacturing, and/or assembly of the DUTs. The second automated test platform may be similar to either the second platform 110 or the third platform 120 and incorporate hardware abstraction and glue layers, as described above with reference to FIGS. 2A and 2B, for example.

In at least one embodiment, the second automated test platform used to perform the sequence of tests at reference numeral 304 may be different than the first automated test platform used to perform the sequence of tests at reference numeral 302. For example, the second automated test platform may include different test instruments, a different test instrument controller, and/or a different test instrument interface as compared to the first automated test platform. As such, the second automated test platform may rely upon a different set of test instrument control commands than the first automated test platform, even to carry out the same signaling transaction on the same DUT. However, because both the first and the second automated test platforms incorporate hardware abstraction and glue layers as described herein, both the first and the second automated test platforms can execute the same test code 310 to test the DUTs.

At reference numeral 306, the process 300 includes performing, on an Nth automated test platform, the sequence of tests defined in the test code 310 to evaluate the same DUTs tested at reference numerals 302 and 304. The testing at reference numeral 306 may be performed at a second stage in the design, development, manufacturing, and/or assembly of the DUTs. Here, it should be appreciated that the same DUTs have been tested multiple times, using different test platforms, with the same test code 310. In other words, the testing at reference numeral 306 is performed by the Nth automated test platform using the same test code 310 that was executed at reference numerals 302 and 304 using other automated test platforms. According to the concepts described herein, any differences in the test instruments or interfaces with the test instruments between the first automated test platform used at reference numeral 302, the second automated test platform used at reference numeral 304, and/or the Nth test platform used at reference numeral 306, can be masked using hardware abstraction and glue layers as described herein. The process 300 can include any number of tests using any number of different test platforms, each incorporating hardware abstraction and glue layers that allow the same test code 310 to be used across all the platforms.

Figure 4:
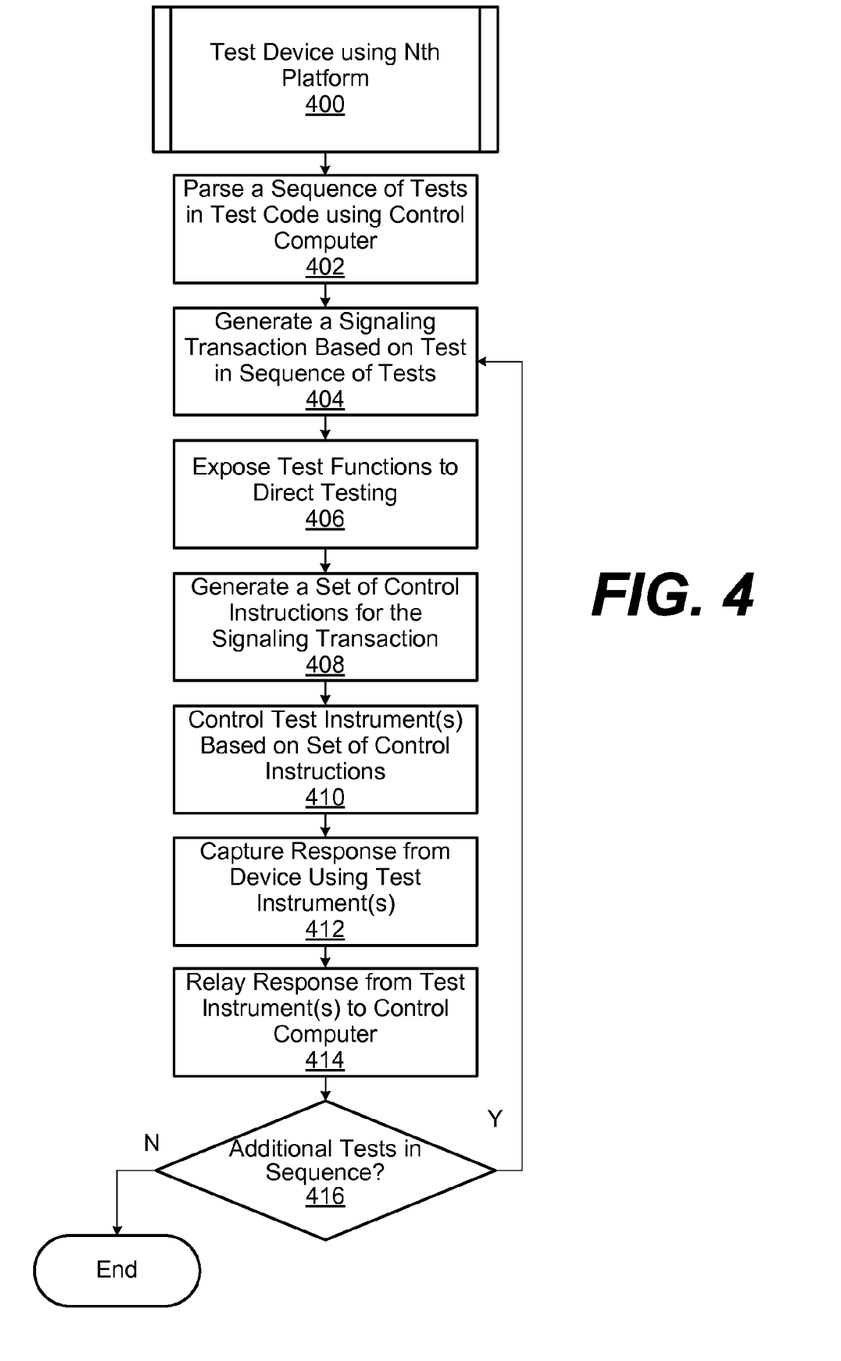
FIG. 4 illustrates a process of testing a device using a testing platform that incorporates hardware abstraction and glue layers according to an example embodiment described herein.

FIG. 4 illustrates a process 400 of testing a device using a testing platform that incorporates hardware abstraction and glue layers according to an example embodiment described herein. At the outset, it is noted that the process 400 may be representative of any one of the testing processes performed at reference numerals 302, 304, or 306 in FIG. 3, for example. In that context, the process 400 can be performed using the second platform 110 shown in FIG. 2A, the third platform 120 shown in FIG. 2B, or another automated test platform that incorporates hardware abstraction and glue layers consistent with the embodiments described herein. Thus, although the process 400 is described below as being performed by the second platform 110 shown in FIG. 2A, the process 400 can be performed by other automated test platforms that incorporate hardware abstraction and glue layers consistent with the embodiments described herein.

At reference numeral 402, the process 400 includes the ATE test controller 220 of the control computer 114 parsing the sequence of tests in the test code 222. For example, one or more processors of the control computer 114 may parse the high-level instructions in the test code 222 and directly execute the instructions on one or more processors of the control computer 114. As part of the execution of the test code 222, the control computer 114 may interface with the hardware abstraction layer 224 to perform the sequence of tests.

Based on the test code 222 executed at reference numeral 402, the process 400 includes the control computer 114 generating a signaling transaction using the hardware abstraction layer 224 at reference numeral 404. For example, the hardware abstraction layer 224 can generate a signaling transaction including a particular combination of logic level input signals and timings for various inputs of the DUT being tested by the second platform 110. Similarly, for other types of tests defined in the test code 222, the hardware abstraction layer 224 can generate one or more other signaling transactions to access and test various features of the DUT.

As noted above, because the manner of signaling one DUT to access and test it may be different than for other DUTs, the hardware abstraction layer 224 may generate different signaling transactions for different DUTs. Thus, the hardware abstraction layer 224 can be considered a type of low level driver that generates signaling transactions to test devices using the second platform 110, and each signaling transaction may include a sequence of logic levels to be applied, at certain timings, to one or more control inputs of the DUTs.

At reference numeral 406, the process 400 includes exposing a plurality of test functions to direct the test instruments 112. Here, the control computer 114 can execute the glue layer 226 to expose variables, functions, function calls, etc. to the higher layers of the test software stack (e.g., the hardware abstraction layer 224 and/or the test code 222) executing as parts of the ATE test controller 220. By doing so, the glue layer 226 exposes functions through which the hardware abstraction layer 224 and/or the test code 222 can direct the test instruments 112 using a standard set of variables, functions, function calls, etc. Those functions can be called by the hardware abstraction layer 224, for example, to implement the signaling transaction generated at reference numeral 404.

At reference numeral 408, the process 400 includes the control computer 114 generating a set of control commands based the signaling transaction generated at reference numeral 404. More particularly, the glue layer 226 converts the signaling transaction generated at reference numeral 404 into a set of control commands that direct the test instruments 112 to carry out the signaling transaction generated at reference numeral 404 on the DUT being tested by the second platform 110. The control commands may comprise a set of test-instrument-specific low-level control commands understood by the test instrument controller 230 and/or the instruments A-D 240-243. As discussed above, the control commands may be specific to the type of the interface 115, the communications protocol used over the interface 115, the test instrument controller 230, and/or the instruments A-D 240-243. By exposing the standard set of variables, functions, etc. and generating the set of control commands when those functions are called and variables used, the glue layer 226 abstracts the interface between the control computer 114 and the test instruments 112.

At reference numeral 410, the process 400 includes the test instrument controller 230 controlling the instruments A-D 240-243 based on the control commands generated at reference numeral 408. In that context, the test instrument controller 230 may control the instruments A-D 240-243 to turn power supplies on and off, to set voltages for logic levels on various inputs, transition logic levels (e.g., on, off, true, false, etc.) at certain times, set impedance states for certain inputs, read voltages at certain times, etc. At this time, the DUT is tested by the second platform 110.

At reference numeral 412, the process 400 includes capturing a response from the DUT using the test instruments 112. The response can be captured based on one or more output signals from the DUT being tested by the second platform 110 at a timing defined by the control instructions generated at reference numeral 408, for example. Once the response is captured, the process 400 includes relaying the response through the glue layer 226 and/or the hardware abstraction layer 224 as feedback for evaluation by the ATE test controller 220 at reference numeral 414.

At reference numeral 416, the process 400 includes determining whether additional tests remain in the sequence of tests defined in the test code 222. The decision at reference numeral 416 can be based on the response feedback relayed to the ATE test controller 220 at reference numeral 412. For example, if the response feedback indicates that the DUT has failed to generate an expected output response, no additional testing may be required and the execution of the test code 222 may end at reference numeral 416. Alternatively, if the response feedback indicates that the DUT generated an expected output response, the process 400 may proceed back to reference numeral 404 to generate a new signaling transaction for a new test. The test code 222 can include several logical branches, each leading to a separate test sequence, based on responses from DUTs.

If the process 400 were executed on the third platform 120 shown in FIG. 2B, it should be appreciated that the result of the processes at reference numerals 402, 404, and 406 may be the same as that described above for the second platform 110. However, because the test instruments 112 of the second platform 110 are different than the test instruments 122 of the third platform 120, the control commands generated at reference numeral 408 would be different for the third platform 120 than for the second platform 110. The difference in the control commands can be accounted for by the difference in the glue layer 226 of the second platform 110 as compared to the glue layer 266 of the third platform 120, as described herein. Generally, the glue layers 226 and 266 can be relied upon to mask the differences between the test instruments 112 of the second platform 110 and the test instruments 122 of the third platform 120, so that the same higher-level test code can be executed by both platforms.

Figure 5:
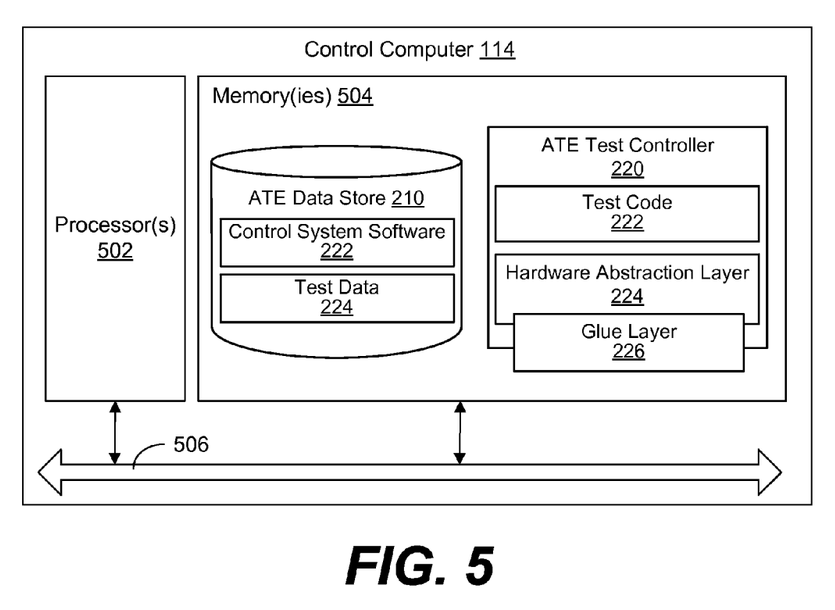
FIG. 5 illustrates a representative schematic block diagram of the control computer of the testing platform illustrated in FIG. 2A according to an example embodiment described herein.

FIG. 5 illustrates a representative schematic block diagram of the control computer 114 of the second platform 110 illustrated in FIG. 2A. The control computer 114 includes at least one processing system, for example, having a processor 502 and a memory 504, both of which are electrically and communicatively coupled to a local interface 506. The local interface 506 can be embodied as a data bus with an accompanying address/control bus or other addressing, control, and/or command lines.

The memory 504 stores data and software or executable-code components executable by the processor 502. For example, an operating system can be stored in the memory 504 for execution by the processor 502. Where any component discussed herein is implemented in the form of software, any one of a number of programming languages can be employed such as, for example, C, C++, C#, Objective C, JAVA®, JAVASCRIPT®, Perl, PHP, VISUAL BASIC®, PYTHON®, RUBY, FLASH®, or other programming languages.

As discussed above, in various embodiments, the memory 504 stores software for execution by the processor 502. In this respect, the terms "executable" or "for execution" refer to software forms that can ultimately be run or executed by the processor 502, whether in source, object, machine, or other form. Examples of executable programs include, for example, a compiled program that can be translated into a machine code format and loaded into a random access portion of the memory 504 and executed by the processor 502, source code that can be expressed in an object code format and loaded into a random access portion of the memory 504 and executed by the processor 502, or source code that can be interpreted by another executable program to generate instructions in a random access portion of the memory 504 and executed by the processor 502, etc.

An executable program can be stored in any portion or component of the memory 504 including, for example, a random access memory (RAM), read-only memory (ROM), magnetic or other hard disk drive, solid-state, semiconductor, or similar drive, universal serial bus (USB) flash drive, memory card, optical disc (e.g., compact disc (CD) or digital versatile disc (DVD)), floppy disk, magnetic tape, or other memory component.

In various embodiments, the memory 504 can include both volatile and nonvolatile memory and data storage components. Volatile components are those that do not retain data values upon loss of power. Nonvolatile components are those that retain data upon a loss of power. Thus, the memory 504 can include, for example, a RAM, ROM, magnetic or other hard disk drive, solid-state, semiconductor, or similar drive, USB flash drive, memory card accessed via a memory card reader, floppy disk accessed via an associated floppy disk drive, optical disc accessed via an optical disc drive, magnetic tape accessed via an appropriate tape drive, and/or other memory component, or any combination thereof. In addition, the RAM can include, for example, a static random access memory (SRAM), dynamic random access memory (DRAM), or magnetic random access memory (MRAM), and/or other similar memory device. The ROM can include, for example, a programmable read-only memory (PROM), erasable programmable read-only memory (EPROM), electrically erasable programmable read-only memory (EEPROM), or other similar memory device.

As discussed above, the ATE test controller 220 can be embodied, at least in part, by software or executable-code components for execution by general purpose hardware. Alternatively the same can be embodied in dedicated hardware or a combination of software, general, specific, and/or dedicated purpose hardware. If embodied in such hardware, each can be implemented as a circuit or state machine, for example, that employs any one of or a combination of a number of technologies. These technologies can include, but are not limited to, discrete logic circuits having logic gates for implementing various logic functions upon an application of one or more data signals, application specific integrated circuits (ASICs) having appropriate logic gates, field-programmable gate arrays (FPGAs), or other components, etc.

The flowchart or process diagrams in FIGS. 3 and 4 are representative of certain processes, functionality, and operations of the embodiments discussed herein. Each block can represent one or a combination of steps or executions in a process. Alternatively or additionally, each block can represent a module, segment, or portion of code that includes program instructions to implement the specified logical function(s). The program instructions can be embodied in the form of source code that includes human-readable statements written in a programming language or machine code that includes numerical instructions recognizable by a suitable execution system such as the processor 502. The machine code can be converted from the source code, etc. Further, each block can represent, or be connected with, a circuit or a number of interconnected circuits to implement a certain logical function or process step.

Although the flowchart or process diagrams in FIGS. 3 and 4 illustrate a specific order, it is understood that the order can differ from that which is depicted. For example, an order of execution of two or more blocks can be scrambled relative to the order shown. Also, two or more blocks shown in succession in FIGS. 3 and 4 can be executed concurrently or with partial concurrence. Further, in some embodiments, one or more of the blocks shown in FIGS. 3 and 4 can be skipped or omitted. In addition, any number of counters, state variables, warning semaphores, or messages might be added to the logical flow described herein, for purposes of enhanced utility, accounting, performance measurement, or providing troubleshooting aids, etc. It is understood that all such variations are within the scope of the present disclosure.

Also, any logic or application described herein, including ATE test controller 220 that are embodied, at least in part, by software or executable-code components, can be embodied or stored in any tangible or non-transitory computer-readable medium or device for execution by an instruction execution system such as a general purpose processor. In this sense, the logic can be embodied as, for example, software or executable-code components that can be fetched from the computer-readable medium and executed by the instruction execution system. Thus, the instruction execution system can be directed by execution of the instructions to perform certain processes such as those illustrated in FIGS. 3 and 4. In the context of the present disclosure, a "computer-readable medium" can be any tangible medium that can contain, store, or maintain any logic, application, software, or executable-code component described herein for use by or in connection with an instruction execution system.

The computer-readable medium can include any physical media such as, for example, magnetic, optical, or semiconductor media. More specific examples of suitable computer-readable media include, but are not limited to, magnetic tapes, magnetic floppy diskettes, magnetic hard drives, memory cards, solid-state drives, USB flash drives, or optical discs. Also, the computer-readable medium can include a RAM including, for example, an SRAM, DRAM, or MRAM. In addition, the computer-readable medium can include a ROM, a PROM, an EPROM, an EEPROM, or other similar memory device.

Disjunctive language, such as the phrase "at least one of X, Y, or Z," unless specifically stated otherwise, is to be understood with the context as used in general to present that an item, term, etc., can be either X, Y, or Z, or any combination thereof (e.g., X, Y, and/or Z). Thus, such disjunctive language is not generally intended to, and should not, imply that certain embodiments require at least one of X, at least one of Y, or at least one of Z to be each present.

It should be emphasized that the above-described embodiments of the present disclosure are merely possible examples of implementations set forth for a clear understanding of the principles of the disclosure. Many variations and modifications can be made to the above-described embodiment(s) without departing substantially from the spirit and principles of the disclosure. All such modifications and variations are intended to be included herein within the scope of this disclosure and protected by the following claims.

Therefore, at least the following is claimed:

1. An automated test platform, comprising:
   a first test instrument to evaluate a semiconductor device under test;
   a first control computer configured to direct the first test instrument, the first control computer comprising a first memory that stores first computer-readable instructions for testing the semiconductor device and a processor to execute the first computer-readable instructions, wherein the first computer-readable instructions define at least:
      a test layer that defines a sequence of tests for evaluation of the semiconductor device;
      a device hardware abstraction layer that generates, based on the sequence of tests, a signaling transaction to test the semiconductor device according to an operating specification of the semiconductor device, the signaling transaction defining at least one logic level for at least one control signal input of the semiconductor device at a particular timing; and
      a first glue layer that exposes a plurality of test functions for the first control computer to direct the first test instrument and generates a set of control commands for the first test instrument to carry out the signaling transaction on the semiconductor device using the first test instrument; and
   a second control computer comprising a second memory that stores second computer-readable instructions, wherein the second computer-readable instructions define a second glue layer that exposes the plurality of test functions and generates a second set of control commands for a second test instrument to carry out the signaling transaction using a second test instrument.

2. The automated test platform according to claim 1, wherein:

the first glue layer further captures, using the first test instrument, a response from the semiconductor device to the signaling transaction and relays the response to the device hardware abstraction layer; and the device hardware abstraction layer further accepts, from the first glue layer, the response from the semiconductor device and relays the response to the test layer.

3. The automated test platform according to claim 2, wherein the sequence of tests includes a logical decision branch directed according to the response from the semiconductor device.

4. The automated test platform according to claim 1, wherein the first glue layer converts the plurality of test functions for at least one of the test layer or the device hardware abstraction layer into control commands for the first test instrument.

5. A method of cross-platform testing, comprising:
performing, on a first automated test platform, a sequence of tests defined in test code to evaluate a semiconductor device under test, wherein performing the sequence of tests on the first automated test platform comprises:
generating, by a first control computer of the first automated test platform, a signaling transaction to test the semiconductor device based on the sequence of tests;
exposing, by the first control computer, a plurality of test functions to direct a first test instrument of the first automated test platform; and
converting, by the first control computer, a call to at least one of the plurality of test functions into a first set of control commands to direct the first test instrument to carry out the signaling transaction on the semiconductor device; and
performing, on a second control computer of a second automated test platform, the sequence of tests defined in the test code to evaluate the semiconductor device under test, the second automated test platform including a second test instrument directed by a second set of control commands to carry out the signaling transaction on the semiconductor device.

6. The method of cross-platform testing according to claim 5, wherein performing the sequence of tests on the second automated test platform comprises:
exposing, by the second control computer, the plurality of test functions to direct the second test instrument; and
converting, by the second control computer, a call to at least one of the plurality of test functions into the second set of control commands to direct the second test instrument to carry out the signaling transaction on the semiconductor device.

7. The method of cross-platform testing according to claim 6, wherein the first set of control commands is different than the second set of control commands.

8. The method of cross-platform testing according to claim 5, further comprising:
capturing, using the first test instrument, a response from the semiconductor device to the signaling transaction; and
performing, on the first automated test platform, a test among the sequence of tests based on the response from the semiconductor device.

9. The method of cross-platform testing according to claim 8, wherein the sequence of tests includes a logical decision branch directed according to the response from the semiconductor device.

10. The method of cross-platform testing according to claim 5, wherein the signaling transaction is generated according to an operating specification of the semiconductor device.

11. The method of cross-platform testing according to claim 5, wherein the signaling transaction defines at least one logic level for at least one control signal input of the semiconductor device at a particular timing.

12. The method of cross-platform testing according to claim 5, wherein exposing the plurality of test functions comprises exposing at least one variable, function, or function call to control the first test instrument.

13. A cross-platform test system, comprising:
a first automated test platform, comprising:
a first test instrument controller to direct a first test instrument; and
a first glue layer interface that exposes a plurality of test functions to direct testing by the first test instrument; and
a second automated test platform, comprising:
a second test instrument controller to direct a second test instrument; and
a second glue layer interface that exposes the plurality of test functions to direct testing by the second test instrument, wherein the first test instrument is controlled by different control commands than the second test instrument.

14. The cross-platform test system according to claim 13, wherein the first automated test platform further comprises:
a first control computer to execute a sequence of tests defined in test code; and
a first interface between the first control computer and the first test instrument controller, wherein:
the first test instrument controller comprises a digital signal processor to provide input signals to a semiconductor device under test and evaluate output signals from the semiconductor device under test; and
the first glue layer interface converts the plurality of test functions for the first control computer into first control commands for the first test instrument.

15. The cross-platform test system according to claim 14, wherein the second automated test platform further comprises:
a second control computer to execute the sequence of tests defined in the test code; and
a second interface between the second control computer and the second test instrument controller, wherein:
the second test instrument controller comprises a second digital signal processor to provide input signals to a second semiconductor device under test and evaluate output signals from the second semiconductor device under test; and
the second glue layer interface converts the plurality of test functions for the second control computer into second control commands for the second test instrument.

16. The cross-platform test system according to claim 15, wherein the first test instrument controller directs the first test instrument using a different test control protocol than the second test instrument controller uses to direct the second test instrument.

17. The cross-platform test system according to claim 13, wherein the first automated test platform further comprises:
a first control computer to execute a sequence of tests defined in test code; and a first device hardware abstraction layer interface that generates, based on the sequence of tests, a signaling transaction to test a semiconductor device according to an operating specification of the semiconductor device.

18. The cross-platform test system according to claim 17, wherein the signaling transaction defines at least one logic level for at least one control signal input of the semiconductor device.

19. The cross-platform test system according to claim 18, wherein the first glue layer interface generates a set of control commands to direct the first test instrument controller based on the signaling transaction.

20. The cross-platform test system according to claim 18, wherein the signaling transaction is generated according to an operating specification of the semiconductor device.

* * * * *